United States Patent
Kobayashi

(10) Patent No.: US 10,062,684 B2
(45) Date of Patent: Aug. 28, 2018

(54) TRANSITION FREQUENCY MULTIPLIER SEMICONDUCTOR DEVICE

(71) Applicant: RF Micro Devices, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/014,348

(22) Filed: Feb. 3, 2016

(65) Prior Publication Data

US 2016/0225760 A1 Aug. 4, 2016

Related U.S. Application Data

(60) Provisional application No. 62/111,869, filed on Feb. 4, 2015.

(51) Int. Cl.
*H01L 23/62* (2006.01)
*H01L 27/06* (2006.01)
*H01L 29/08* (2006.01)
*H01L 27/02* (2006.01)
(Continued)

(52) U.S. Cl.
CPC ........ *H01L 27/0629* (2013.01); *H01L 23/66* (2013.01); *H01L 27/0207* (2013.01); *H01L 29/0847* (2013.01); *H01L 27/088* (2013.01)

(58) Field of Classification Search
CPC ..................................... H01L 23/62
See application file for complete search history.

(56) References Cited

U.S. PATENT DOCUMENTS 4,236,119 A  11/1980 Battjes
4,317,055 A  2/1982 Yoshida et al.
4,540,954 A  9/1985 Apel
(Continued)

FOREIGN PATENT DOCUMENTS

EP  1187229 A1  3/2002
EP  1826041 A1  8/2007
(Continued)

OTHER PUBLICATIONS

Final Office Action for U.S. Appl. No. 13/871,526, dated Jul. 7, 2017, 15 pages.
(Continued)

*Primary Examiner* — Marvin Payen
(74) *Attorney, Agent, or Firm* — Withrow & Terranova, P.L.L.C.

(57) ABSTRACT

A transition frequency multiplier semiconductor device having a first source region, a second source region, and a common drain region is disclosed. A first channel region is located between the first source region and the common drain region, and a second channel region is located between the second source region and the common drain region. A first gate region is located within the first channel region to control current flow between the first source region and the common drain region, while a second gate region is located within the second channel region to control current flow between the second source region and the common drain region. An inactive channel region is located between the first channel region and the second channel region such that the first channel region is electrically isolated from the second channel region. A conductive interconnect couples the first source region to the second gate region.

20 Claims, 13 Drawing Sheets

(51) Int. Cl.
*H01L 23/66* (2006.01)
*H01L 27/088* (2006.01)

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,406,111 A | 4/1995 | Sun |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,418,174 B1 | 7/2002 | Benedict |
| 6,448,793 B1 | 9/2002 | Barratt et al. |
| 6,455,877 B1 | 9/2002 | Ogawa et al. |
| 6,455,925 B1 | 9/2002 | Laureanti |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 | 10/2003 | Andrys et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,135,747 B2 | 11/2006 | Allen et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,923,826 B2 | 4/2011 | Takahashi et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,110,915 B2 | 2/2012 | Fowlkes et al. |
| 8,237,198 B2 | 8/2012 | Wu et al. |
| 8,405,068 B2 | 3/2013 | O'Keefe |
| 8,502,258 B2 | 8/2013 | O'Keefe |
| 8,530,978 B1 | 9/2013 | Chu et al. |
| 8,633,518 B2 | 1/2014 | Suh et al. |
| 8,692,294 B2 | 4/2014 | Chu et al. |
| 8,729,680 B2 | 5/2014 | Kobayashi et al. |
| 8,785,976 B2 | 7/2014 | Nakajima et al. |
| 8,937,338 B2 | 1/2015 | Chowdhury et al. |
| 8,988,097 B2 | 3/2015 | Ritenour |
| 9,070,761 B2 | 6/2015 | Johnson |
| 9,082,836 B2 | 7/2015 | Senda |
| 9,093,420 B2 | 7/2015 | Kobayashi et al. |
| 9,124,221 B2 | 9/2015 | Vetury et al. |
| 9,129,802 B2 | 9/2015 | Ritenour |
| 9,136,341 B2 | 9/2015 | Kobayashi et al. |
| 2001/0040246 A1 | 11/2001 | Ishii |
| 2001/0054848 A1 | 12/2001 | Baudelot et al. |
| 2002/0005528 A1 | 1/2002 | Nagahara |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |

(56) References Cited

U.S. PATENT DOCUMENTS

| | | |
|---|---|---|
| 2004/0144991 A1 | 7/2004 | Kikkawa |
| 2004/0227211 A1 | 11/2004 | Saito et al. |
| 2004/0241916 A1 | 12/2004 | Chau et al. |
| 2005/0006639 A1 | 1/2005 | Dupuis et al. |
| 2005/0110042 A1 | 5/2005 | Saito et al. |
| 2005/0121730 A1 | 6/2005 | Asano et al. |
| 2005/0139868 A1 | 6/2005 | Anda |
| 2005/0145874 A1 | 7/2005 | Saxler |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2005/0274977 A1 | 12/2005 | Saito et al. |
| 2006/0003556 A1 | 1/2006 | Lee et al. |
| 2006/0043385 A1 | 3/2006 | Wang et al. |
| 2006/0043501 A1 | 3/2006 | Saito et al. |
| 2006/0054924 A1 | 3/2006 | Saito et al. |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2006/0244010 A1 | 11/2006 | Saxler |
| 2006/0246680 A1 | 11/2006 | Bhattacharyya |
| 2006/0249750 A1 | 11/2006 | Johnson et al. |
| 2006/0255377 A1 | 11/2006 | Tu |
| 2007/0026676 A1 | 2/2007 | Li et al. |
| 2007/0093009 A1 | 4/2007 | Baptist et al. |
| 2007/0138545 A1 | 6/2007 | Lin et al. |
| 2007/0158692 A1 | 7/2007 | Nakayama et al. |
| 2007/0164326 A1 | 7/2007 | Okamoto et al. |
| 2007/0205433 A1 | 9/2007 | Parikh et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0079023 A1 | 4/2008 | Hikita et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0217753 A1 | 9/2008 | Otani |
| 2008/0272382 A1 | 11/2008 | Kim et al. |
| 2008/0272422 A1 | 11/2008 | Min |
| 2008/0283821 A1 | 11/2008 | Park et al. |
| 2008/0296618 A1 | 12/2008 | Suh et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0200576 A1 | 8/2009 | Saito et al. |
| 2009/0267078 A1 | 10/2009 | Mishra et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0025737 A1 | 2/2010 | Ishikura |
| 2010/0109018 A1 | 5/2010 | Chen et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0079771 A1 | 4/2011 | Kanamura et al. |
| 2011/0095337 A1 | 4/2011 | Sato |
| 2011/0101300 A1 | 5/2011 | O'Keefe |
| 2011/0108887 A1 | 5/2011 | Fareed et al. |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0199955 A1 | 8/2012 | Sun |
| 2012/0211802 A1 | 8/2012 | Tamari |
| 2012/0218783 A1 | 8/2012 | Imada |
| 2012/0262220 A1 | 10/2012 | Springett |
| 2013/0032897 A1 | 2/2013 | Narayanan et al. |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |
| 2014/0264266 A1 | 9/2014 | Li et al. |
| 2014/0264454 A1 | 9/2014 | Banerjee et al. |

FOREIGN PATENT DOCUMENTS

| | | |
|---|---|---|
| JP | H10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Advisory Action and Examiner-Initiated Interview Summary for U.S. Appl. No. 13/871,526, dated Sep. 8, 2017, 4 pages.
Notice of Allowance for U.S. Appl. No. 13/871,526, dated Nov. 1, 2017, 11 pages.
Notice of Allowance for U.S. Appl. No. 13/914,060, dated Nov. 13, 2014, 8 pages.
Non-Final Office Action for U.S. Appl. No. 13/966,400, dated Sep. 3, 2014, 9 pages.
Final Office Action for U.S. Appl. No. 13/966,400, dated Dec. 3, 2014, 8 pages.
Non-Final Office Action for U.S. Appl. No. 13/957,698, dated Nov. 5, 2014, 11 pages.
International Search Report and Written Opinion for PCT/US2013/056132, dated Oct. 10, 2013, 11 pages.
Final Office Action for U.S. Appl. No. 13/973,482, dated Nov. 5, 2014, 9 pages.
International Search Report and Written Opinion for PCT/US2013/056187, dated Oct. 10, 2013, 11 pages.
Non-Final Office Action for U.S. Appl. No. 13/973,482, dated May 23, 2014, 8 pages.
Non-Final Office Action for U.S. Appl. No. 13/795,986, dated Apr. 24, 2014, 13 pages.
Final Office Action for U.S. Appl. No. 13/795,986, dated Dec. 5, 2014, 16 pages.
International Search Report for GB0902558.6, dated Jun. 15, 2010, by the UK Intellectual Property Office, 2 pages.
Examination Report for British Patent Application No. 0902558.6, dated Nov. 16, 2012, 5 pages.
Examination Report for British Patent Application No. GB0902558.6, dated Feb. 28, 2013, 2 pages.
Non-Final Office Action for U.S. Appl. No. 12/705,869, dated Feb. 9, 2012, 10 pages.
Notice of Allowance for U.S. Appl. No. 12/705,869, dated Apr. 4, 2013, 9 pages.
Notice of Allowance for U.S. Appl. No. 12/705,869, dated Jul. 19, 2012, 8 pages.
Advisory Action for U.S. Appl. No. 12/841,225, dated Apr. 16, 2012, 3 pages.
Final Office Action for U.S. Appl. No. 12/841,225 dated Feb. 1, 2012, 9 pages.

(56) References Cited

OTHER PUBLICATIONS

Non-Final Office Action for U.S. Appl. No. 12/841,225, dated May 2, 2012, 10 pages.
Non-Final Office Action for U.S. Appl. No. 12/841,225 dated Dec. 22, 2011, 8 pages.
Non-Final Office Action for U.S. Appl. No. 12/841,257 dated Jan. 5, 2012, 13 pages.
Notice of Allowance for U.S. Appl. No. 13/795,926, dated Apr. 27, 2015, 8 pages.
Notice of Allowance for U.S. Appl. No. 13/942,998, dated Apr. 27, 2015, 8 pages.
Final Office Action for U.S. Appl. No. 13/871,526, dated Jun. 17, 2015, 11 pages.
Advisory Action for U.S. Appl. No. 13/871,526, dated Sep. 3, 2015, 3 pages.
International Preliminary Report on Patentability for PCT/US2013/056105, dated Mar. 5, 2015, 12 pages.
Advisory Action for U.S. Appl. No. 13/910,202, dated Apr. 6, 2015, 3 pages.
Notice of Allowance for U.S. Appl. No. 13/910,202, dated May 14, 2015, 9 pages.
International Preliminary Report on Patentability for PCT/US2013/056126, dated Mar. 5, 2015, 7 pages.
Final Office Action for U.S. Appl. No. 13/974,488, dated Feb. 20, 2015, 8 pages.
Notice of Allowance for U.S. Appl. No. 13/974,488, dated May 29, 2015, 9 pages.
Notice of Allowance for U.S. Appl. No. 13/966,400, dated Feb. 20, 2015, 8 pages.
Notice of Allowance for U.S. Appl. No. 13/957,698, dated Mar. 30, 2015, 7 pages.
Corrected/Supplemental Notice of Allowability for U.S. Appl. No. 13/957,689, dated May 20, 2015, 3 pages.
Corrected/Supplement Notice of Allowability for U.S. Appl. No. 13/957,689, dated Jun. 9, 2015, 4 pages.
Notice of Allowance for U.S. Appl. No. 13/957,698, dated Jul. 20, 2015, 7 pages.
Non-Final Office Action for U.S. Appl. No. 14/557,940, dated Aug. 31, 2015, 8 pages.
International Preliminary Report on Patentability for PCT/US2013/056132, dated Mar. 5, 2015, 9 pages.
International Preliminary Report on Patentability for PCT/US2013/056187, dated Mar. 12, 2015, 9 pages.
Notice of Allowance for U.S. Appl. No. 13/973,482, dated May 4, 2015, 7 pages.
Notice of Allowance for U.S. Appl. No. 13/795,986, dated Mar. 6, 2015, 8 pages.
Non-Final Office Action for U.S. Appl. No. 14/067,019, dated Mar. 25, 2015, 7 pages.
Advisory Action for U.S. Appl. No. 10/620,205, dated Feb. 15, 2005, 2 pages.
Notice of Allowance for U.S. Appl. No. 10/620,205, dated Dec. 8, 2005, 4 pages.
Notice of Allowance for U.S. Appl. No. 12/841,225, dated Nov. 9, 2012, 5 pages.
Non-Final Office Action for U.S. Appl. No. 14/749,274, dated Feb. 22, 2016, 6 pages.
Corrected/Supplemental Notice of Allowability for U.S. Appl. No. 13/957,698, dated Nov. 4, 2015, 4 pages.
Final Office Action for U.S. Appl. No. 14/557,940, dated Feb. 8, 2016, 8 pages.
Notice of Allowance for U.S. Appl. No. 14/067,019, dated Oct. 13, 2015, 6 pages.
U.S. Appl. No. 09/723,274, filed Nov. 27, 2000, now U.S. Pat. No. 6,560,452.
U.S. Appl. No. 10/620,205, filed Jul. 15, 2003, now U.S. Pat. No. 7,033,961.
U.S. Appl. No. 10/689,980, filed Oct. 20, 2003, now U.S. Pat. No. 7,052,942.
U.S. Appl. No. 11/397,279, filed Apr. 4, 2006, now U.S. Pat. No. 7,408,182.
U.S. Appl. No. 10/689,979, filed Oct. 20, 2003, now U.S. Pat. No. 7,026,665.
U.S. Appl. No. 11/360,734, filed Feb. 23, 2006, now U.S. Pat. No. 7,459,356.
U.S. Appl. No. 11/937,207, filed Nov. 8, 2007, now U.S. Pat. No. 7,968,391.
U.S. Appl. No. 11/458,833, filed Jul. 20, 2006, now U.S. Pat. No. 7,557,421.
U.S. Appl. No. 13/795,926, filed Mar. 12, 2013, now U.S. Pat. No. 9,136,341.
U.S. Appl. No. 14/749,274, filed Jun. 24, 2015.
U.S. Appl. No. 13/942,998, filed Jul. 16, 2013, now U.S. Pat. No. 9,124,221.
U.S. Appl. No. 13/871,526, filed Mar. 26, 2013.
U.S. Appl. No. 13/910,202, filed Jun. 5, 2013, now U.S. Pat. No. 9,142,202.
U.S. Appl. No. 13/927,182, filed Jun. 26, 2013.
U.S. Appl. No. 13/974,488, filed Aug. 23, 2013, now U.S. Pat. No. 9,147,632.
U.S. Appl. No. 14/797,573, filed Jul. 13, 2015.
U.S. Appl. No. 13/914,060, filed Jun. 10, 2013, now U.S. Pat. No. 8,988,097.
U.S. Appl. No. 13/966,400, filed Aug. 14, 2013, now U.S. Pat. No. 9,070,761.
U.S. Appl. No. 13/957,698, filed Aug. 2, 2013, now U.S. Pat. No. 9,202,874
U.S. Appl. No. 13/973,482, filed Aug. 22, 2013, now U.S. Pat. No. 9,129,802
U.S. Appl. No. 14/067,019, filed Oct. 30, 2013, now U.S. Pat. No. 9,325,281
U.S. Appl. No. 13/795,986, filed Mar. 12, 2013, now U.S. Pat. No. 9,093,420
U.S. Appl. No. 14/731,736, filed Jun. 5, 2015
U.S. Appl. No. 14/557,940, filed Dec. 2, 2014
U.S. Appl. No. 09/253,625, filed Feb. 19, 1999, now U.S. Pat. No. 6,418,174
U.S. Appl. No. 14/847,558, filed Sep. 8, 2015
Notice of Allowance for U.S. Appl. No. 14/749,274, dated Aug. 15, 2016, 7 pages.
Notice of Allowance for U.S. Appl. No. 14/847,558, dated Aug. 8, 2016, 9 pages.
Dogan, S. et al., "4H—SiC photoconductive switching devices for use in high-power applications," Applied Physics Letters, vol. 82, No. 18, May 5, 2003, pp. 3107-3109.
James, C. et al., "High Voltage Photoconductive Switches using Semi-Insulating, Vanadium doped 6H-SiC," 2009 IEEE Pulsed Power Conference, Jun. 28, 2009, IEEE, pp. 283-286.
Sullivan, J. S. et al., "6H-SiC Photoconductive Switches Triggered at Below Bandgap Wavelengths," IEEE Transactions on Dielectrics and Electrical Insulation, vol. 14, No. 4, Aug. 2007, pp. 980-985.
Sun, M. G. et al., "Magnetic-field-controllable avalanche breakdown and giant magnetoresistive effects in Gold/semi-insulating-GaAs Schottky diode," Applied Physics Letters, vol. 85, No. 23, Dec. 6, 2004, pp. 5643-5645.
Final Office Action for U.S. Appl. No. 13/871,526, dated Aug. 30, 2016, 14 pages.
Advisory Action and Examiner-Initiated Interview Summary for U.S. Appl. No. 13/871,526, dated Oct. 31, 2016, 4 pages.
Advisory Action and Examiner-Initiated Interview Summary for U.S. Appl. No. 13/871,526, dated Nov. 18, 2016, 5 pages.
Non-Final Office Action for U.S. Appl. No. 13/871,526, dated Jan. 5, 2017, 15 pages.
Notice of Allowance for U.S. Appl. No. 14/797,573, dated Dec. 20, 2016, 7 pages.
Author Unknown, "CGHV1J006D: 6 W, 18.0 GHz, GaN HEMT Die," Cree, Inc., 2014, 9 pages.
Boutros, K.S., et al., "5W GaN MMIC for Millimeter-Wave Applications," 2006 Compound Semiconductor Integrated Circuit Symposium, Nov. 2006, pp. 93-95.

(56) References Cited

OTHER PUBLICATIONS

Chang, S.J. et al., "Improved ESD protection by combining InGaN-GaN MQW LEDs with GaN Schottky diodes," IEEE Electron Device Letters, Mar. 2003, vol. 24, No. 3, pp. 129-131.
Chao, C-H., et al., "Theoretical demonstration of enhancement of light extraction of flip-chip GaN light-emitting diodes with photonic crystals," Applied Physics Letters, vol. 89, 2006, 4 pages.
Cho, H., et al., "High Density Plasma Via Hole Etching in SiC," Journal of Vacuum Science & Technology A: Surfaces and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.
Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.
Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.
Hibbard, D.L. et al., "Low Resistance High Reflectance Contacts to p-GaN Using Oxidized Ni/Au and Al or Ag," Applied Physics Letters, vol. 83, No. 2, Jul. 14, 2003, pp. 311-313.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN-GaN light-emitting diodes," Applied Physics Letters, vol. 89, 071109, Aug. 2006, 4 pages.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Wierer, J.J., et al., "High-power AlGaInN flip-chip light-emitting diodes," Applied Physics Letters, vol. 78, No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Final Office Action for U.S. Appl. No. 10/620,205, dated Dec. 16, 2004, 9 pages.
Non-Final Office Action for U.S. Appl. No. 10/620,205, dated Jul. 23, 2004, 7 pages.
Non-Final Office Action for U.S. Appl. No. 10/620,205, dated May 3, 2005, 10 pages.
Non-Final Office Action for U.S. Appl. No. 10/689,980, dated Jan. 26, 2005, 7 pages.
Non-Final Office Action for U.S. Appl. No. 10/689,980, dated May 12, 2005, 8 pages.
Non-Final Office Action for U.S. Appl. No. 11/397,279, dated Oct. 31, 2007, 7 pages.
Notice of Allowance for U.S. Appl. No. 11/397,279, dated Apr. 17, 2008, 7 pages.
Final Office Action for U.S. Appl. No. 10/689,979, dated Jun. 29, 2005, 16 pages.
Non-Final Office Action for U.S. Appl. No. 10/689,979, dated Jan. 11, 2005, 14 pages.
Notice of Allowance for U.S. Appl. No. 10/689,979, dated Oct. 26, 2005, 6 pages.
Non-Final Office Action for U.S. Appl. No. 11/360,734, dated Jan. 18, 2008, 10 pages.
Notice of Allowance for U.S. Appl. No. 11/360,734, dated Aug. 7, 2008, 6 pages.
Final Office Action for U.S. Appl. No. 11/937,207, dated Nov. 19, 2009, 9 pages.
Non-Final Office Action for U.S. Appl. No. 11/937,207, dated Mar. 18, 2010, 10 pages.
Non-Final Office Action for U.S. Appl. No. 11/937,207, dated May 29, 2009, 11 pages.
Notice of Allowance for U.S. Appl. No. 11/937,207, dated Feb. 28, 2011, 8 pages.
Quayle Action for U.S. Appl. No. 11/937,207, dated Nov. 24, 2010, 4 pages.
Final Office Action for U.S. Appl. No. 11/458,833, dated Dec. 15, 2008, 13 pages.
Non-Final Office Action for U.S. Appl. No. 11/458,833, dated Apr. 1, 2008, 10 pages.
Notice of Allowance for U.S. Appl. No. 11/458,833, dated Mar. 9, 2009, 7 pages.
Non-Final Office Action for U.S. Appl. No. 13/795,926, dated Dec. 19, 2014, 14 pages.
Non-Final Office Action for U.S. Appl. No. 13/942,998, dated Nov. 19, 2014, 9 pages.
Non-Final Office Action for U.S. Appl. No. 13/871,526, dated Dec. 16, 2014, 17 pages.
Invitation to Pay Fees for PCT/US2013/056105, dated Nov. 5, 2013, 7 pages.
International Search Report and Written Opinion for PCT/US2013/056105, dated Feb. 12, 2014, 15 pages.
Non-Final Office Action for U.S. Appl. No. 13/910,202, dated Sep. 25, 2014, 9 pages.
Final Office Action for U.S. Appl. No. 13/910,202, dated Jan. 20, 2015, 10 pages.
International Search Report and Written Opinion for PCT/US2013/056126, dated Oct. 25, 2013, 10 pages.
Non-Final Office Action for U.S. Appl. No. 13/927,182, dated May 1, 2014, 7 pages.
Final Office Action for U.S. Appl. No. 13/927,182, dated Sep. 17, 2014, 10 pages.
Non-Final Office Action for U.S. Appl. No. 13/974,488, dated Oct. 28, 2014, 8 pages.
Huang, Xiucheng et al., "Analytical Loss Model of High Voltage GaN HEMT in Cascade Configuration," IEEE Transactions on Power Electronics, vol. 29, No. 5, May 2014, IEEE, pp. 2208-2219.
Lee, Han S., "GaN-on-Silicon-Based Power Switch in Sintered, Dual-Side Cooled Package," PowerElectronics.com, Jan. 2, 2013, 5 pages, http://powerelectronics.com/discrete-power-semis/gan-silicon-based-power-switch-sintered-dual-side-cooled-package.
Liang, Zhenxian et al., "Embedded Power-An Integration Packaging Technology for IPEMs," The International Journal of Microcircuits and Electronic Packaging, vol. 23, No. 4, 2000, pp. 481-487.
Li, Xueqing et al., "Investigation of SiC Stack and Discrete Cascades" PowerPoint Presentation, PCIM Europe, May 20-22, 2014, Nuremberg, Germany, 26 slides.
Stevanovic, Ljubisa D. et al., "Low Inductance Power Module with Blade Connector," 2010 Twenty-Fifth Annual IEEE Applied Power Electronics Conference and Exposition (APEC), Feb. 21-25, 2010, IEEE, Palm Springs, CA, pp. 1603-1609.
Lin, C.K. et al., "GaN Lattice Matched $ZnO/Pr_2O_3$ Film as Gate Dielectric Oxide Layer for AlGaN/GaN HEMT," IEEE International Conference of Electron Devices and Solid-State Circuits, EDSSC 2009, IEEE, Dec. 25-27, 2009, Xi'an, China, pp. 408-411.
Lin, H. C. et al., "Leakage current and breakdown electric-field studies on ultrathin atomic-layer-deposited $Al_2O_3$ on GaAs," Applied Physics Letters, vol. 87, 2005, pp. 182094-1 to 182094-3.
Lossy, R. et al., "Gallium nitride MIS-HEMT using atomic layer deposited Al2O3 as gate dielectric," Journal of Vacuum Science & Technology A: Vacuum, Surfaces, and Films, vol. 31, No. 1, Jan./Feb. 2013, 6 pages.
Seok, O. et al., "High-breakdown voltage and low on-resistance AlGaN/GaN on Si MOS-HEMTs employing an extended Tan gate on HfO2 gate insulator," Electronics Letters, vol. 49, No. 6, Institute of Engineering and Technology, Mar. 14, 2013, 2 pages.

(56) References Cited

OTHER PUBLICATIONS

Tang, K. et al., "Enhancement-mode GaN Hybrid MOS-HEMTs with Breakdown Voltage of 1300V," 21st International Symposium on Power Semiconductor Devices & IC's, ISPSD 2009, IEEE, Jun. 14-18, 2009, Barcelona, Spain, pp. 279-282.

Ye, P.D., et al., "GaN MOS-HEMT Using Atomic Layer Deposition Al2O3 as Gate Dielectric and Surface Passivation," International Journal of High Speed Electronics and Systems, vol. 14, No. 3, 2004, pp. 791-796.

Non-Final Office Action for U.S. Appl. No. 14/731,736, dated Jan. 14, 2016, 10 pages.

Liang, Zhenxian et al., "Embedded Power-A Multilayer Integration Technology for Packaging of IPEMs and PEBBs," Proceedings of International Workshop on Integrated Power Packaging, Jul. 14-16, 2000, IEEE, pp. 41-45.

Non-Final Office Action for U.S. Appl. No. 13/871,526, dated Mar. 8, 2016, 13 pages.

Notice of Allowance for U.S. Appl. No. 14/731,736, dated May 9, 2016, 8 pages.

Final Office Action for U.S. Appl. No. 14/749,274, dated Jun. 23, 2016, 6 pages.

Non-Final Office Action for U.S. Appl. No. 14/797,573, dated Jul. 7, 2016, 8 pages.

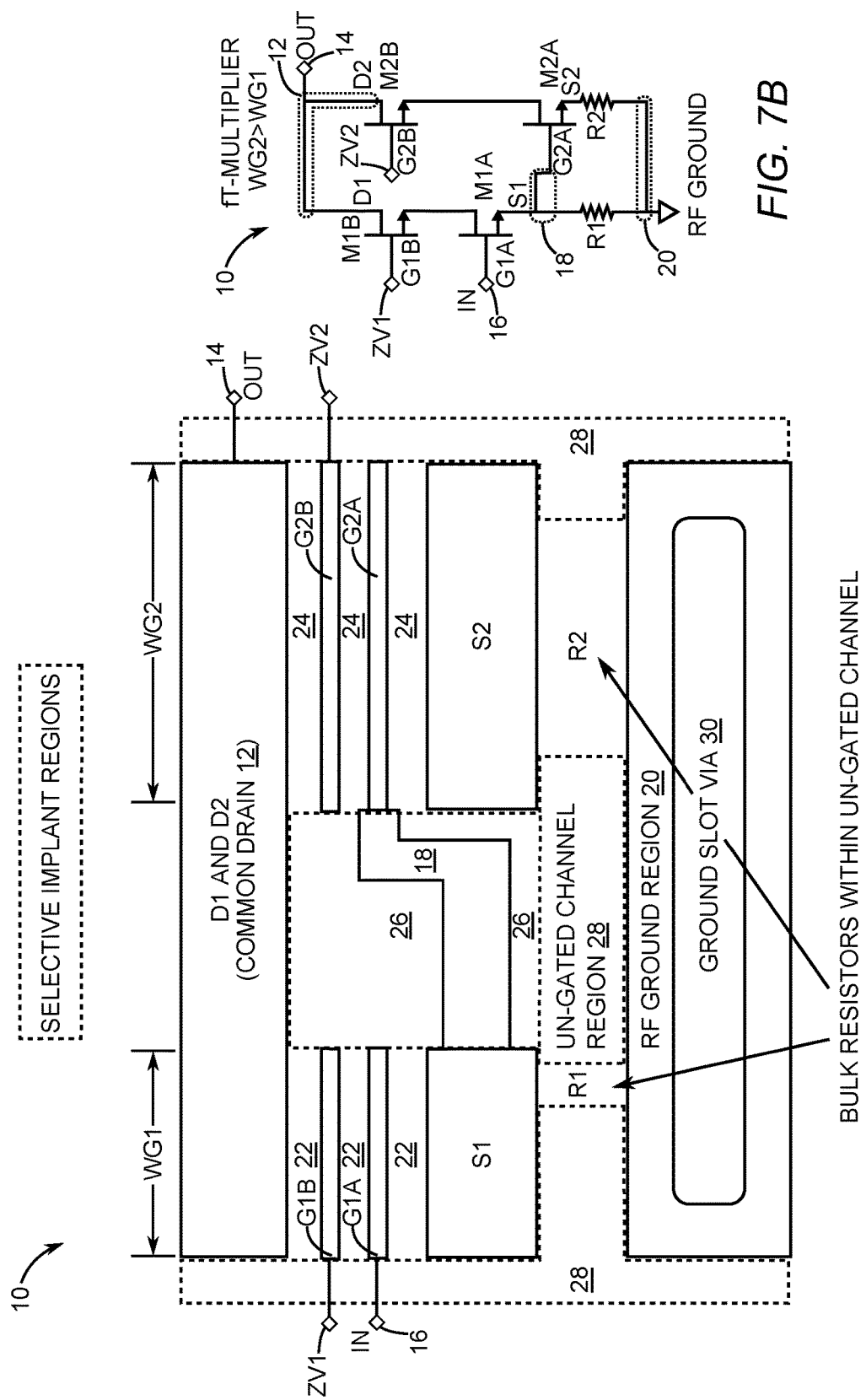

TRANSITION FREQUENCY MULTIPLIER SEMICONDUCTOR DEVICE

RELATED APPLICATIONS

This application claims the benefit of U.S. provisional patent application Ser. No. 62/111,869, filed Feb. 4, 2015, the disclosure of which is incorporated herein by reference in its entirety.

FIELD OF THE DISCLOSURE

The present disclosure is related to semiconductor devices that are configured to extend transition frequencies for millimeter wave (mmW) and beyond radio frequency applications.

BACKGROUND

Often a semiconductor technology's usefulness for the radio frequency (RF) space can be characterized by the transition frequency (fT)-breakdown voltage product known as the Johnson-limit. A high fT-breakdown product can be obtained by using semiconductor technologies that possess high electron velocity and wide energy band-gap. A gallium nitride (GaN) high electron mobility transistor (HEMT) is an example of a semiconductor device that possesses high electron velocity and a wide energy band-gap.

In addition, multi-transistor circuit topologies such as the Darlington-pair, cascode, and multi-stacked transistors can be used to improve the fT-breakdown product through higher voltage operation, fT multiplication, and thermal mitigation. These techniques are challenging as frequency and/or power is increased due to interconnect parasitics effects, especially in the millimeter wave (mmW) and terahertz (THz) regimes. Thus, it is desirable to have a transition frequency multiplier semiconductor device that has a structure with low inductive and capacitive parasitics. It is particularly desirable that the transition frequency multiplier semiconductor device be usable as a fundamental building block for extending the fT-breakdown product of short gate-length enhancement mode (E-mode) GaN transistor technology.

SUMMARY

A transition frequency multiplier semiconductor device having a first source region, a second source region, and a common drain region is disclosed. A first channel region is located between the first source region and the common drain region, and a second channel region is located between the second source region and the common drain region. A first gate region is located within the first channel region to control current flow between the first source region and the common drain region, while a second gate region is located within the second channel region to control current flow between the second source region and the common drain region. An inactive channel region is located between the first channel region and the second channel region such that the first channel region is electrically isolated from the second channel region. A conductive interconnect couples the first source region to the second gate region.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 7A is a cross sectional view of a device layout for a fifth embodiment of the transition frequency multiplier semiconductor device of FIGS. 1A and 1B that further illustrates a slight modification to the stacked fT-multiplier of the fourth embodiment shown in FIGS. 6A and 6B.

FIG. 7B is a schematic diagram of the fifth embodiment of the transition frequency multiplier semiconductor device as structured in FIG. 7A.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
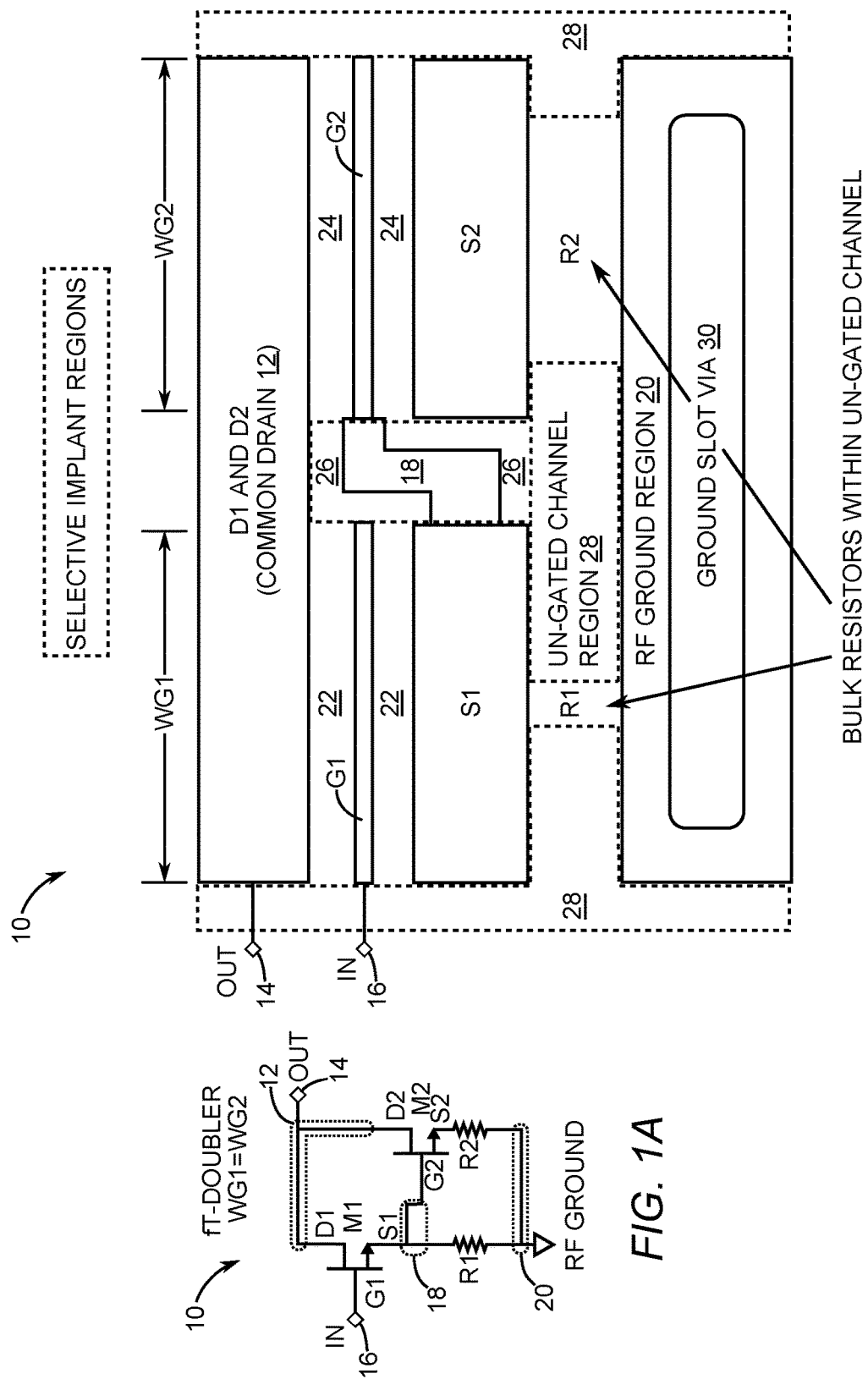
FIG. 1A is a schematic of a first embodiment of a transition frequency multiplier semiconductor device configured as a transition frequency doubler.
FIG. 1B is a cross sectional view of a device layout for the transition frequency multiplier semiconductor device, which in this first embodiment has a Darlington like configuration shown in FIG. 1A.

FIG. 1A is a schematic of a first embodiment of a transition frequency multiplier semiconductor device 10 configured as a transition frequency doubler. The transition frequency multiplier semiconductor device 10 is represented symbolically by a first transistor M1 and a second transistor M2 coupled in a Darlington like configuration. The first transistor M1 has a first gate region G1, a first drain region D1, and a first source region S1. The second transistor M2 has a second gate region G2, a second drain region D2, and a second source region S2. The first drain region D1 and the second drain region D2 form a common drain region 12 that is coupled to an output terminal 14. The first gate region G1 is coupled to an input terminal 16. The first source region S1 is coupled to the second gate region G2 by way of a conductive interconnect 18. A first resistor R1 couples the first source Region S1 to an RF ground region 20, and a second resistor R2 couples the second source region S2 to the RF ground region 20. The first resistor R1 can be a current source bulk resistance that sets a bias point for the first transistor M1. The second resistor R2 can be a bulk resistance that provides feedback for setting RF and direct current (DC) characteristics for the transition frequency multiplier semiconductor device 10. The first resistor R1 can be replaced by a diode connected gated channel to provide current source biasing for the first transistor M1.

FIG. 1B is a cross sectional view of a device layout for the transition frequency multiplier semiconductor device 10, which in this first embodiment has the Darlington like configuration shown in FIG. 1A. Fabrication of the transition frequency multiplier semiconductor device 10 involves reconfiguring a common-source multi-finger device structure by ion implantation damage or by a selective mesa etch to isolate the first source region S1 from the second source region S2, and to isolate the first gate region G1 from the second gate region G2. The common drain region 12 is not sub-divided and maintains a continuous stripe connection as typical for a single multi-finger device, which is true for all embodiments of this disclosure. Low inductive and low capacitive parasitics are obtained by using the continuous stripe connection to realize the common drain region 12.

Although the schematic of FIG. 1A symbolically depicts two transistors (i.e., the first transistor M1 and the second transistor M2), the transition frequency multiplier semiconductor device 10 is a compact composite device partially due to common drain region 12. In this exemplary case, the transition frequency multiplier semiconductor device 10 is the multi-fingered common source (CS) device that follows a D-G-S-G-D stripe formation typically found in a conventional multi-finger field effect transistor (FET) device. A first channel region 22 and a second channel region 24 are defined by implantation. The first gate region G1 and the second gate region G2 are formed by omitting gate metal formation in the middle of a first gate stripe that would typically be present if the first gate region G1 and the second gate region G2 were continuously coupled. The first channel region 22 and the second channel region 24 are separated by an inactive channel region 26 that can be formed by an isolated damage implant or alternatively by a mesa etch isolation. The inactive channel region 26 is depicted within a dashed outline that defines the first channel region 22 from the second channel region 24. The first source Region S1 and the second source region S2 are also separated by the inactive channel region 26. Note that the first gate region G1, the first channel region 22, and the first source Region S1 each have a first width WG1. The second gate region G2, the second channel region 24, and the second source region S2 each have a second width WG2. In this first embodiment, the first width WG1 and the second width WG2 are substantially equal.

In this exemplary embodiment, the inactive channel region 26 can be continuous with an un-gated channel region 28 that separates the first source Region S1 and the second source region S2 from the RF ground region 20. Selective implantation can extend from the un-gated channel region 28 to along edges of the transition frequency multiplier semiconductor device 10. Similar to the fabrication of the inactive channel region 26, the un-gated channel region 28 can also be formed by a selective implant such as ion implantation damage or alternatively by a mesa etch isolation. The first source S1 is electrically coupled to the second gate region G2 by the conductive interconnect 18. In this exemplary case, the RF ground region 20 includes a ground slot via 30.

In at least one embodiment, the first resistor R1 and the second resistor R2 are both compact low parasitic bulk resistors that are located within the un-gated channel region 28. Resistance values of the first resistor R1 and the second resistor R2 are defined by selective implantation. The first resistor R1 and the second resistor R2 in at least one embodiment terminate onto a subsequent drain/source region that comprises the RF ground region 20 and the ground slot via 30. The compact composite device structure shown in FIG. 1B provides an area efficient design that is conducive of high frequency performance that is scalable in size to meet given power requirements.

Figure 2:
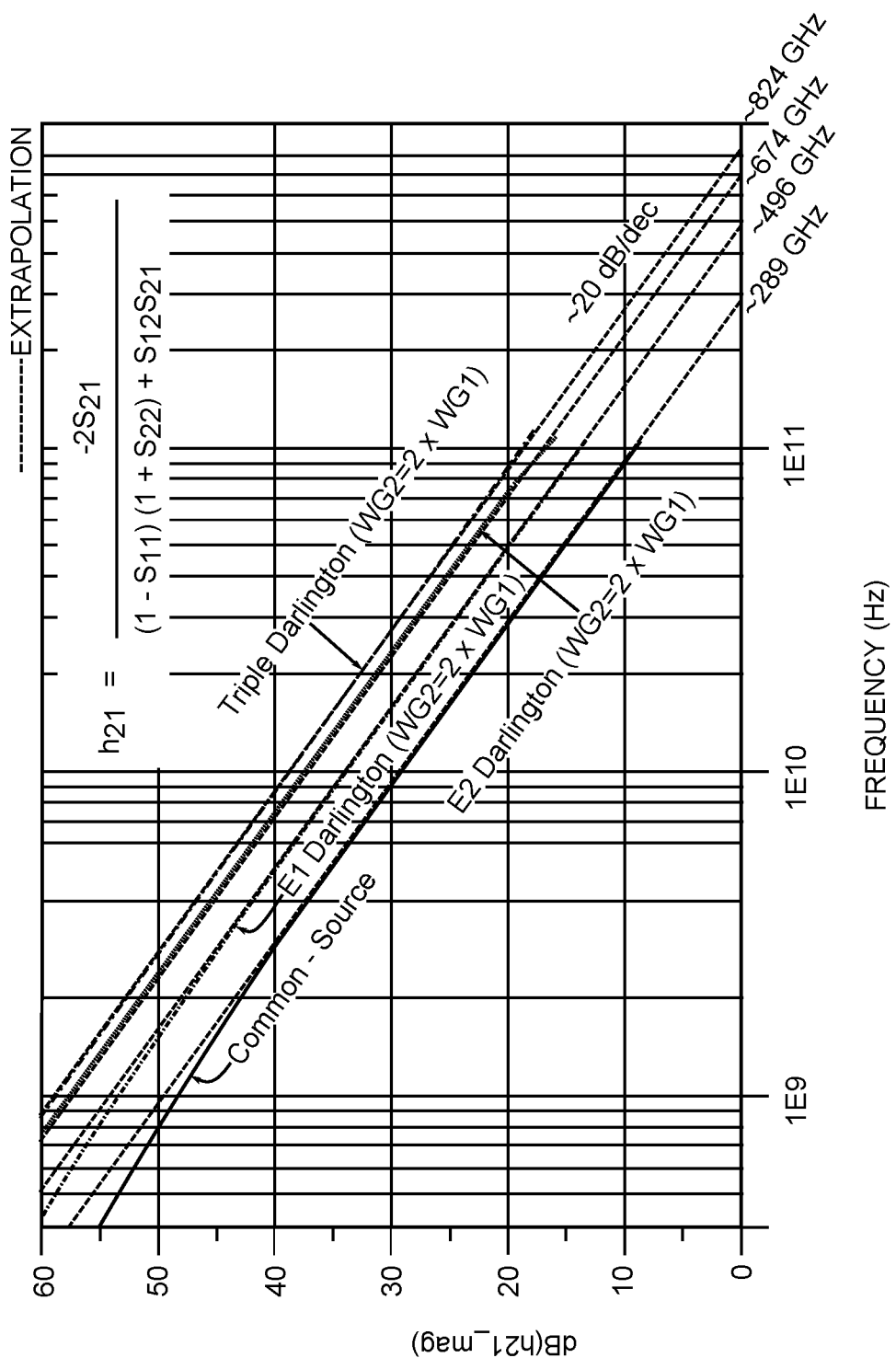
FIG. 2 is a graph of extrapolated cut-off frequency for an enhancement mode (E-mode) gallium nitride (GaN) high electron mobility transistor (HEMT) version of the transition frequency multiplier semiconductor device.

FIG. 2 is a graph of extrapolated cut-off frequency for an enhancement mode (E-mode) gallium nitride (GaN) high electron mobility transistor (HEMT) version of the transition frequency multiplier semiconductor device 10. Based on a typical E-mode GaN technology with a measured transition frequency (fT) of approximately 289 GHz and a drain to gate breakdown voltage (BVdg) of 11V, a simulated fT of the embodiment of FIGS. 1A and 1B based on measured transistor S-parameters is 496 GHz (~500 GHz). In this case, the fT is increased by a factor of 1.7 times over a typical common-source configuration having an fT of 289 GHz. The factor of 1.7 is a practical limit due to non-idealities in the transition frequency multiplier semiconductor device 10. Some of the non-idealities are associated with the first resistor R1.

Figure 3:
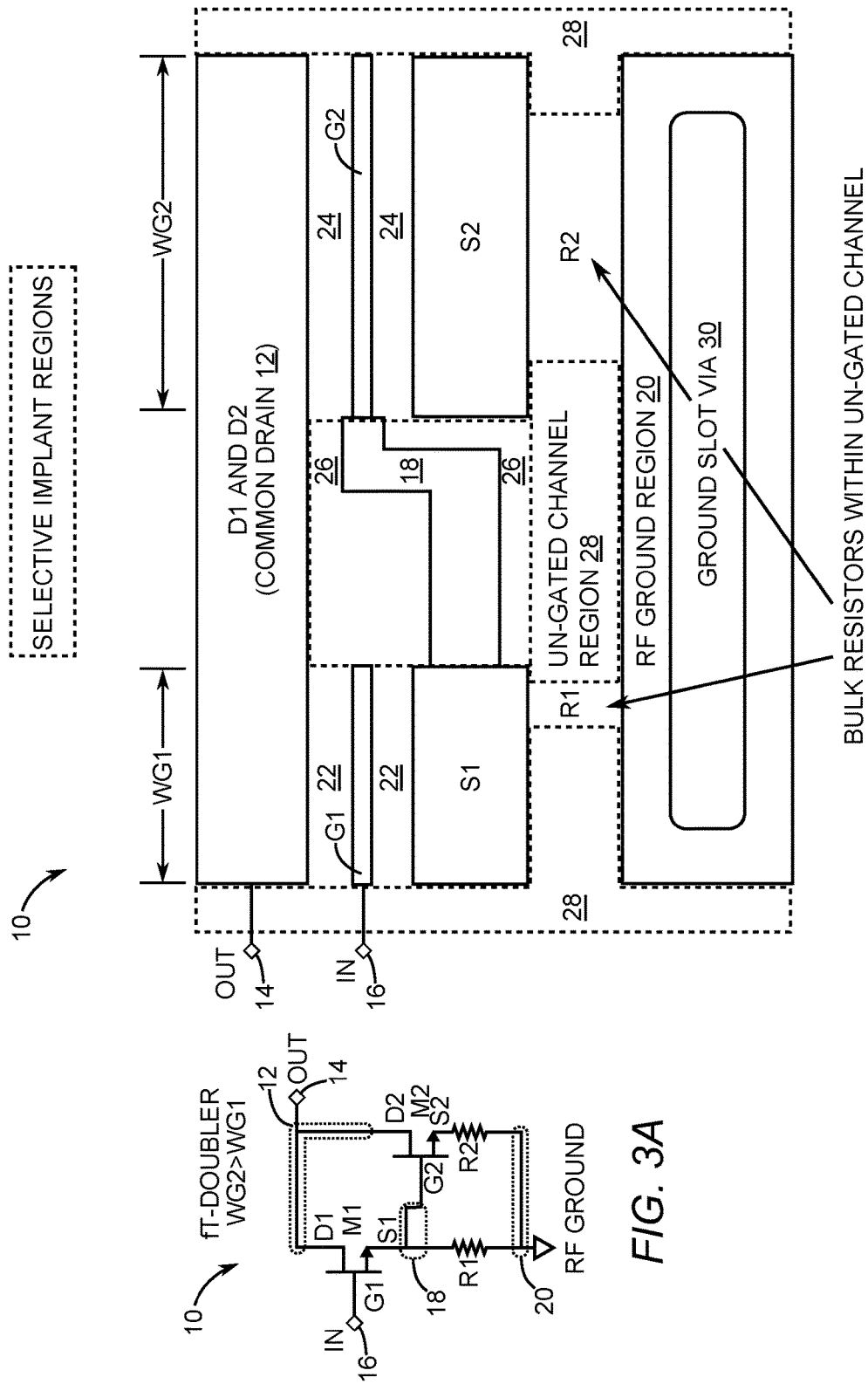
FIG. 3A is a schematic of a second embodiment of the transition frequency multiplier semiconductor device configured to provide a higher transition frequency than the first embodiment of FIGS. 1A and 1B.
FIG. 3B is a cross sectional view of a device layout for the transition frequency multiplier semiconductor device, which in embodiment has a Darlington like configuration shown in FIG. 3A.

FIG. 3A is a schematic of a second embodiment of the transition frequency multiplier semiconductor device 10 that is configured to provide an fT that is higher than the first embodiment of FIGS. 1A and 1B. The second embodiment is similar to the first embodiment, except that the width WG2 of the second gate region G2, the second channel region 24, and the second source region S2, is increased substantially with respect to the first width WG1 of the first channel region 22, the first gate region G1, and the first source region S1. In the exemplary case of FIG. 3B, the second width WG2 is around twice that of the first width WG1. A simulated performance of the case wherein the second width WG2 is two times the first width WG1 predicts an fT of ~674 GHz resulting in a 2.3 times increase in effective fT for a same drain to source voltage (Vds) operation with respect to a common-source device, which has an fT of ~289 GHz. This is an additional 35.6% improvement in fT compared to the fT-doubler case of embodiment 1 where WG2 is equal to WG1.

It is to be understood that the first and second embodiments of the transition frequency multiplier semiconductor device 10 is extendable to a triple Darlington-like topology to increase fT even further. By adding yet a third transistor and a third resistor at the input of the schematics of either FIG. 1A or FIG. 1B, a higher fT of 824 GHz is predicted as illustrated in FIG. 2. Combined with further improvements in the base technology, THz cut-off frequencies are feasible.

Other embodiments of this disclosure increase the operating voltage of the transition frequency multiplier semiconductor device 10 by adding stacked or multiple gates within a long channel region termed "stacked fT-multiplier" in order to further increase the fT-breakdown voltage product (Johnson Figure of Merit). Stacked fT-multiplier embodiments are described in later sections of this disclosure. With the stacked fT-multiplier embodiments, a Johnson Figure of Merit as high as 15 THz-V, or 3 times that predicted by GaN HEMTs, may be feasible based on simulations.

Figure 4:
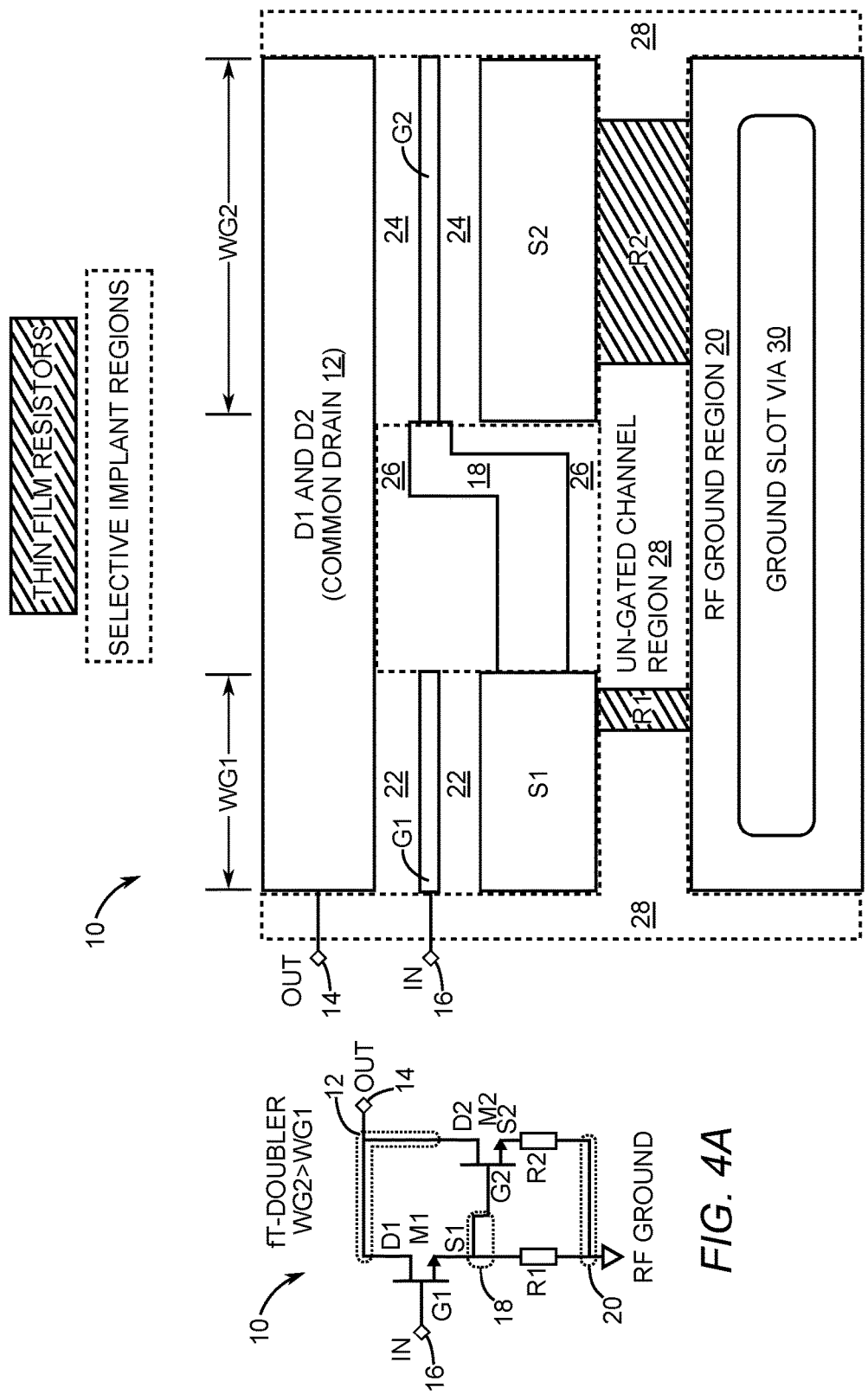
FIG. 4A is a schematic of a third embodiment of the transition frequency multiplier semiconductor device of FIGS. 1A and 1B that further includes thin film resistors.
FIG. 4B is a cross sectional view of a device layout for the third embodiment of the transition frequency multiplier semiconductor device that includes the thin film resistors.

FIG. 4A is a schematic of a third embodiment of the transition frequency multiplier semiconductor device 10 in which the first resistor R1 and the second resistor R2 are thin film resistors instead of bulk resistors. FIG. 4B is a cross sectional view of a device layout for a third embodiment of the transition frequency multiplier semiconductor device 10 that includes the thin film resistors. In this case the un-gated channel region 28 extends uninterrupted above the RF ground region 20. Thin film resistors are typically more accurately processed. Thus, some better control over bias operating points can be achieved. However, it is to be understood that combinations of thin film resistor types and bulk resistor types can be used to maximize total performance of the transition frequency multiplier semiconductor device 10.

Figure 5:
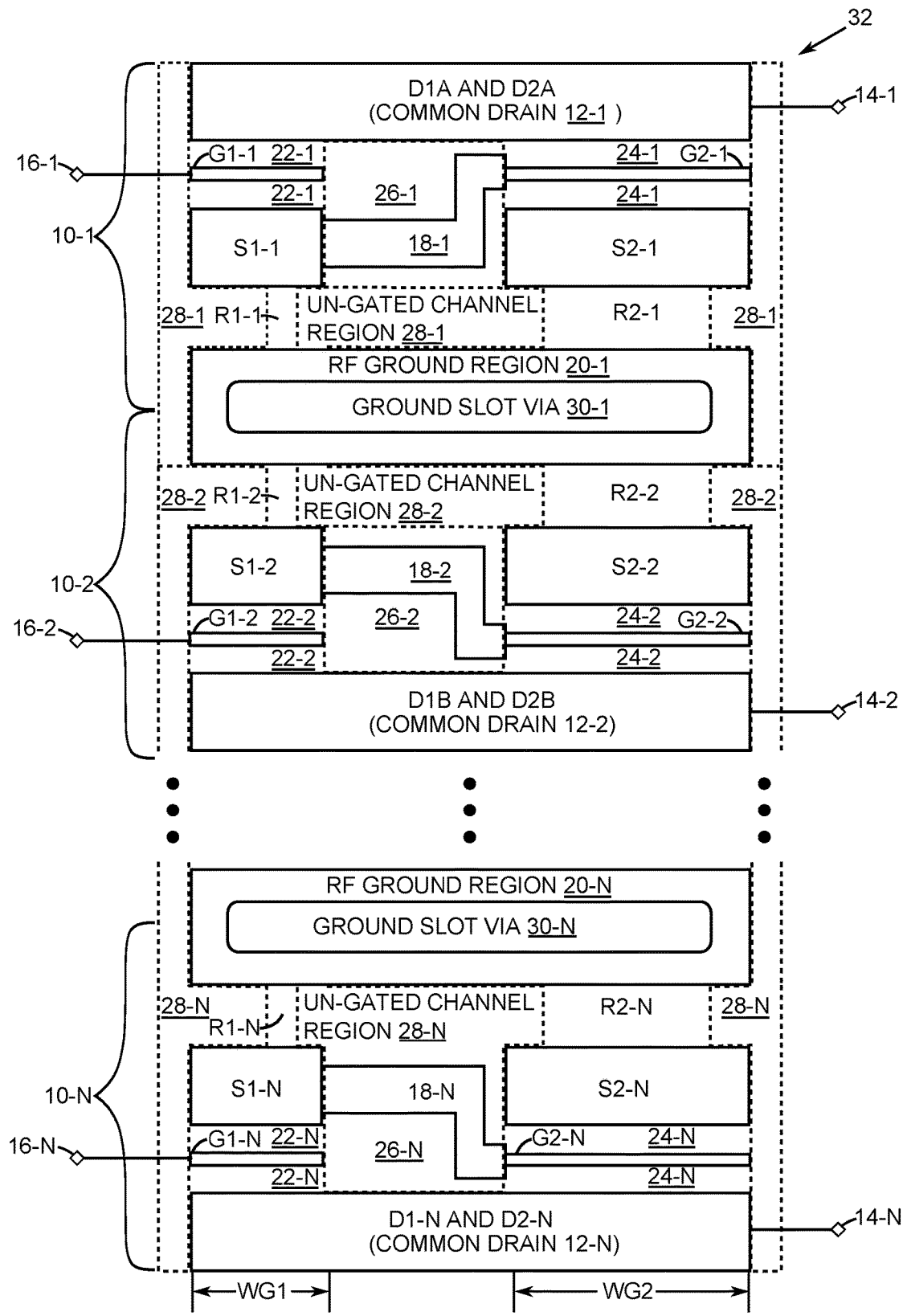
FIG. 5 is an exemplary structural diagram of a transition frequency multiplier array made up of a plurality of transition frequency multiplier semiconductor devices.

FIG. 5 is an exemplary structural diagram of a transition frequency multiplier array 32 made up of a plurality of transition frequency multiplier semiconductor devices 10-1 through 10-N. This embodiment is very similar to a single multi-finger device cell where alternating stripes may include S-G-D regions with integrated slot vias on select source or drain stripes to provide low source inductance and high frequency performance. This particular embodiment also emphasizes the scaling benefits of a striped composite device structure that resembles a single multi-finger field effect transistor (FET) transistor device.

The transition frequency multiplier array 32 that is an NX array is made up of N number of transition frequency multiplier semiconductor devices 10-N that are coupled together, wherein N is a finite integer. The transition frequency multiplier semiconductor device 10-N has a first gate region G1-N, a first drain region D1-N, and a first source region S1-N. The transition frequency multiplier semiconductor device 10-N also includes a second gate region G2-N, a second drain region D2-N, and a second source region S2-N. The first drain region D1-N and the second drain region D2-N form a common drain region 12-N that is coupled to an output terminal 14-N. The first gate region G1-N is coupled to an input terminal 16-N. The first source region S1-N is coupled to the second gate region G2-N by way of a conductive interconnect 18-N. A first resistor R1-N couples the first source region S1-N to an RF ground region 20-N, and a second resistor R2-N couples the second source region S2-N to the RF ground region 20-N. The first resistor R1-N can be a current source bulk resistance and the second resistor R2-N can be a bulk resistance that provides feedback for setting RF and direct current (DC) characteristics for the transition frequency multiplier semiconductor device 10-N. The first resistor R1-N can be replaced by a diode connected gated channel to provide the current source biasing.

Fabrication of the transition frequency multiplier semiconductor device 10-N involves reconfiguring a common-source multi-finger device structure by ion implantation damage or by a selective mesa etch to isolate the first source region S1-N from the second source region S2-N, and to isolate the first gate region G1-N from the second gate region G2-N. The common drain region 12-N is not subdivided and maintains a continuous stripe connection as typical for a single multi-finger device, which is true for all embodiments of this disclosure. Low inductive and low capacitive parasitics are obtained by using the continuous stripe connection to realize the common drain region 12-N.

The transition frequency multiplier semiconductor device 10-N is a compact composite device partially due to common drain region 12-N. In this exemplary case, the transition frequency multiplier semiconductor device 10-N is the multi-fingered common source (CS) device that follows a D-G-S-G-D stripe formation typically found in a conventional multi-finger FET device. A first channel region 22-N and a second channel region 24-N are defined by selective implantation. The first gate region G1-N and the second gate region G2-N are formed by omitting gate metal formation in the middle of a first gate stripe that would typically be present if the first gate region G1-N and the second gate region G2-N were continuously coupled. The first channel region 22-N and the second channel region 24-N are separated by an inactive channel region 26-N that can be formed by an isolated damage implant or alternatively by a mesa etch isolation. The inactive channel region 26-N is depicted within a dashed outline that defines boundaries between the first channel region 22-N and the second channel region 24-N. The first source region S1-N and the second source region S2-N are also separated by the inactive channel region 26-N.

In this exemplary embodiment, the inactive channel region 26-N can be continuous with an un-gated channel region 28-N that separates the first source region S1-N and the second source region S2-N from the RF ground region 20-N. Selective implantation can extend from the un-gated channel region 28-N to along edges of the transition frequency multiplier semiconductor device 10-N. Similar to the fabrication of the inactive channel region 26, the un-gated channel region 28-N can also be formed by a selective implant such as ion implantation damage or alternatively by a mesa etch isolation. The first source S1-N is electrically coupled to the second gate region G2-N by the conductive interconnect 18-N. In this exemplary case, the RF ground region 20-N includes a ground slot via 30-N.

In at least one embodiment, the first resistor R1-N and the second resistor R2-N are both compact low parasitic bulk resistors that are located in an un-gated channel region 28-N. Resistance values of the first resistor R1-N and the second resistor R2-N are defined by selective implantation. The first resistor R1-N and the second resistor R2-N in at least one embodiment terminate onto a subsequent drain/source region that comprises the RF ground region 20-N and the ground slot via 30-N.

A 2× array version of the transition frequency multiplier array 32 comprises only the transition frequency multiplier semiconductor device 10-1 coupled to the transition frequency multiplier semiconductor device 10-2. Notice that the transition frequency multiplier semiconductor device 10-1 and the transition frequency multiplier semiconductor device 10-2 share RF ground region 20-1 and ground slot via 30-1. A 3× array version of the transition frequency multiplier array 32 comprises the transition frequency multiplier semiconductor device 10-2 coupled in between the transition frequency multiplier semiconductor device 10-1 and the transition frequency multiplier semiconductor device 10-N, where N in this particular case is equal to 3. In this particular case, where N equals 3, the transition frequency multiplier semiconductor device 10-N is inverted such that the common drain region 12-N and the common drain region 12-2 are one and the same. Other embodiments of the transition frequency multiplier array 32 include but are not limited to a 4× array version and an 8× array version. An even higher fT-breakdown product or Johnson Figure of Merit (JFoM) is achieved in other embodiments by effectively stacking gated channels in the fT-multiplier, and thereby increasing the effective breakdown and operating voltage.

Figures 6A, 6B:
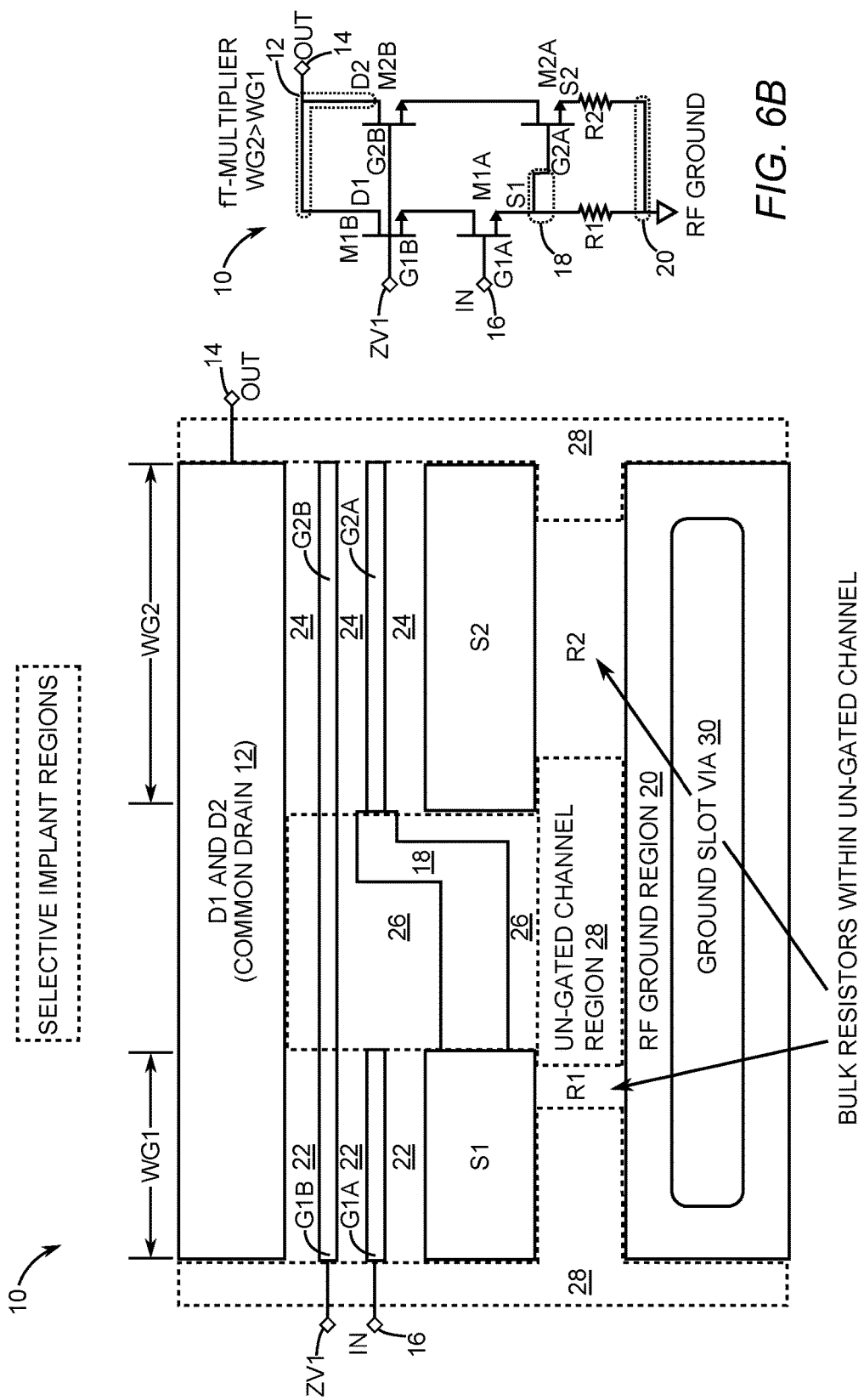
FIG. 6A is a cross sectional view of a device layout for a fourth embodiment of the transition frequency multiplier semiconductor device of FIGS. 1A and 1B that is a 'stacked' fT-multiplier.
FIG. 6B is a schematic of the fourth embodiment of the transition frequency multiplier semiconductor device configured to provide a higher effective source to drain breakdown voltage (BVds) than the previous embodiments.

FIG. 6A is a cross sectional view of a device layout for a fourth embodiment of the transition frequency multiplier semiconductor device 10 that is a 'stacked' fT-multiplier. This fourth embodiment is similar to the second embodiment of FIG. 3, except that the first channel region 22 and the second channel region 24 are increased in length, with increased source to drain channel spacing to provide higher BVdg. In addition to a first gate region G1A and a second gate region G2A, a single metal gate stripe makes up a third gate region G1B and a fourth gate region G2B. The addition of the third gate region G1B and the fourth gate region G2B converts the first channel region 22 and the second channel region 24 into stacked channel regions. As a result, this fourth embodiment of the transition frequency multiplier semiconductor device 10 provides both increased breakdown voltage and increased transition frequency that combine to increase the JFoM.

FIG. 6B is a schematic of a fourth embodiment of the transition frequency multiplier semiconductor device 10 configured to provide a higher effective BVds than the previous embodiments. In this particular case, an active channel made up of the first channel region 22 and the second channel region 24 are represented as a third transistor M1B and a fourth transistor M2B that form two separate cascoded stacked devices in conjunction with the first transistor M1A and the second transistor M2A. The third gate region G1B of the third transistor M1B and the fourth gate region G2B of the fourth transistor M2B are coupled together in this exemplary embodiment. Note that the first transistor M1A and the third transistor M1B are not individual stacked transistor devices in the layout of FIG. 6A, but are instead similar to a typical dual gated channel structure.

The third gate region G1B and the fourth gate region G2B are controlled together by a control signal applied to a control terminal ZV1. However, the first channel region 22 and the second channel region 24 remain isolated by the inactive channel region 26 similar to the previous embodiments.

FIG. 7A is a cross sectional view of a device layout for a fifth embodiment of the transition frequency multiplier semiconductor device 10 that illustrates a slight modification to the stacked fT-multiplier of the fourth embodiment. FIG. 7B is a schematic diagram of the fifth embodiment of the transition frequency multiplier semiconductor device as structured in FIG. 7A. In this case, the third gate region G1B and the fourth gate region G2B are separated to provide individual and separate gate control of the third transistor M1B and the fourth transistor M2B as schematically represented in FIG. 7B. The separation of the third gate region G1B and the fourth gate region G2B allows more design flexibility in providing desired biases and gate termination impedances. For example, having a different impedance on a first control terminal ZV1 than on a second control terminal ZV2 can provide more linear voltage swing for the first transistor M1A, which is raised by one gate to source voltage level of the second transistor M2A above ground potential applied to the RF ground region 20.

Figures 8A, 8B:
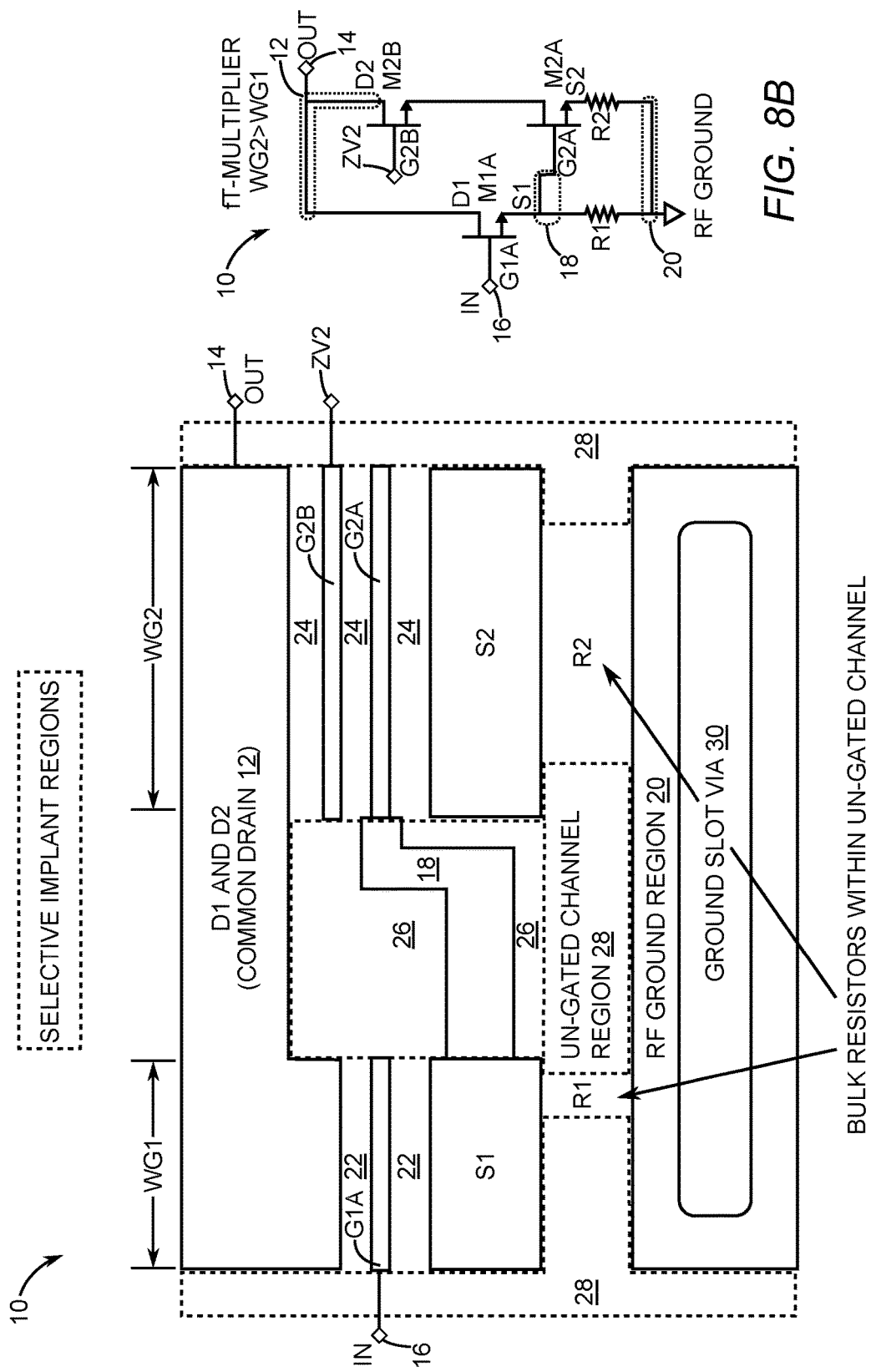
FIG. 8A is a cross sectional view of a device layout for a sixth embodiment of the transition frequency multiplier semiconductor device of FIGS. 1A and 1B. In the sixth embodiment the first channel region has only the first gate region and the second channel region includes both the second gate region and the fourth gate region.
FIG. 8B is a schematic that symbolically illustrates the sixth embodiment of the transition frequency multiplier semiconductor device of FIGS. 1A and 1B that is depicted structurally in FIG. 8A.

FIG. 8A is a cross sectional view of a device layout for a sixth embodiment of the transition frequency multiplier semiconductor device 10 in which the first channel region 22 has only the first gate region G1A and the second channel region 24 includes both the second gate region G2A and the fourth gate region G2B. FIG. 8B is a schematic that symbolically illustrates the sixth embodiment of the transition frequency multiplier semiconductor device 10 that is depicted structurally in FIG. 8A. The second channel region 24 has a longer source to drain length that increases operating voltage and accommodates the stacked arrangement of the second gate region G2A and the fourth gate region G2B. As a result of the stacked structure of the second channel region 24, impedance and bias presented to the fourth gate region G2B is adjustable for a desired amplifier performance.

Figure 9:
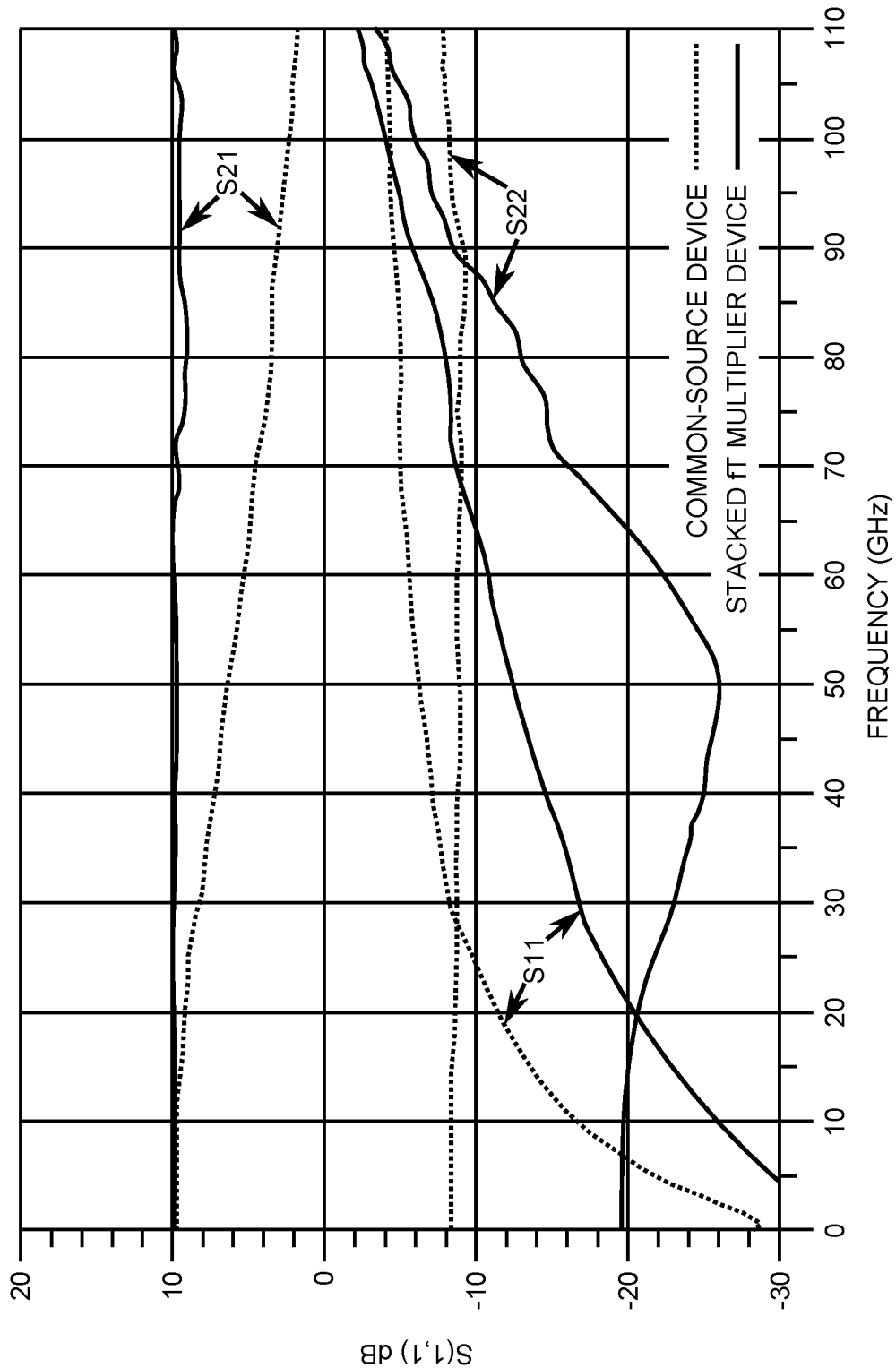
FIG. 9 is a graph showing simulated results for a wideband amplifier implementation using a stacked version of the transition frequency multiplier semiconductor device in comparison with a conventional common-source transistor amplifier.

FIG. 9 is a graph showing simulated results for a wideband amplifier implementation using a stacked version of the transition frequency multiplier semiconductor device 10 in comparison with a conventional common-source transistor amplifier. Simulations of the transition frequency multiplier semiconductor device 10 and the conventional common-source transistor amplifier were both conducted based upon 11V BVdg 289 GHz E-GaN HEMT technology. The plots in the graph of FIG. 9 illustrate that a stacked version of the transition frequency multiplier semiconductor device 10 achieves much wider gain bandwidth as well as matched output impedance as a result of employing both the fT-multiplier and stacked structures. Scattering parameters S11, S21, and S22 are plotted for both the common-source device represented in dashed line and the stacked fT multiplier device performance of the transition frequency multiplier semiconductor device 10 are represented in solid line.

Figure 10C:
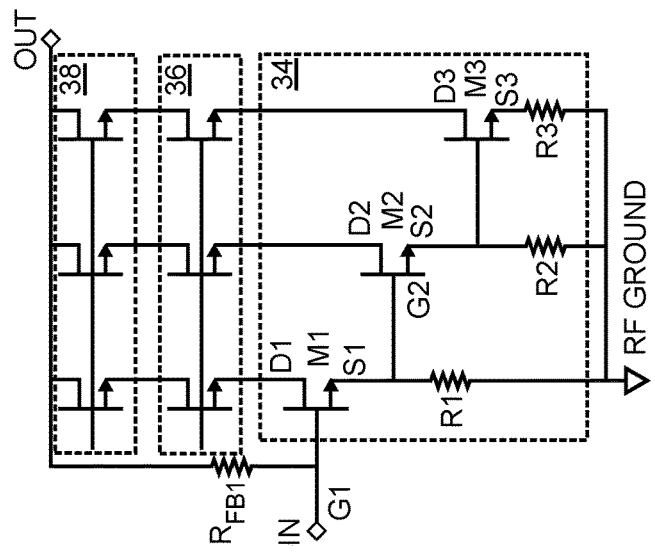
FIG. 10C is a schematic diagram of the triple Darlington type configuration with feedback and the first stacking transistor group along with a second stacking transistor group that makes up a ninth embodiment of the transition frequency multiplier semiconductor device.
Figure 10B:
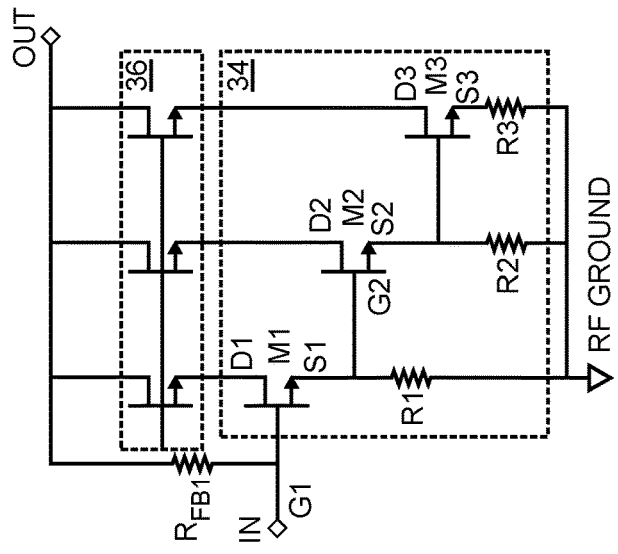
FIG. 10B is a schematic diagram of the triple Darlington type configuration with feedback and a first stacking transistor group that makes up an eighth embodiment of the transition frequency multiplier semiconductor device.
Figure 10A:
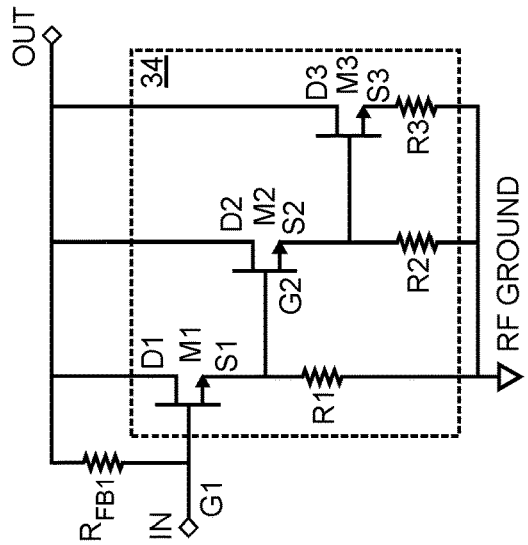
FIG. 10A is a schematic diagram of a triple Darlington type configuration with feedback that is a seventh embodiment of the transition frequency multiplier semiconductor device.

FIG. 10A is a schematic diagram of a triple Darlington type configuration 34 with feedback that makes up a seventh embodiment of the transition frequency multiplier semiconductor device 10. The feedback is provided by coupling a feedback resistor RFB1 from the output to the input. The triple Darlington type configuration 34 adds a third Darlington transistor M3 with a source resistor R3 coupled between a third source region S3 and RF ground region 20. A third gate region G3 of the third transistor M3 is coupled to the second source region S2 of the second transistor M2. A third drain region D3 is coupled to the common drain 12 region. This particular embodiment is referred herein as a non-stacked triple Darlington.

FIG. 10B is a schematic diagram of the triple Darlington type configuration 34 with feedback and a first stacking transistor group 36 that makes up an eighth embodiment of the transition frequency multiplier semiconductor device 10. This particular embodiment is referred to herein as a stacked Darlington.

FIG. 10C is a schematic diagram of the triple Darlington type configuration 34 with feedback and the first stacking transistor group 36 along with a second stacking transistor group 38 that makes up a ninth embodiment of the transition frequency multiplier semiconductor device 10. This particular embodiment is referred to herein as a triple stacked triple Darlington.

Figure 11C:
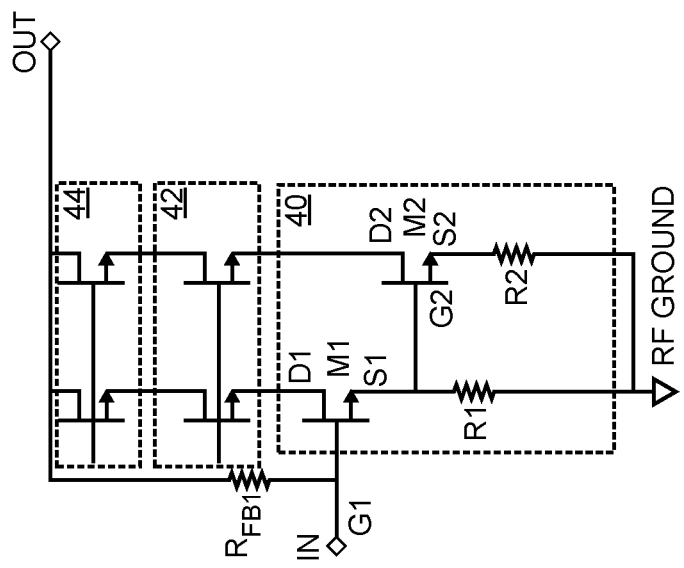
FIG. 11C is a schematic diagram of the Darlington type configuration with feedback and a first stacking transistor pair along with a second stacking transistor pair that makes up a twelfth embodiment of the transition frequency multiplier semiconductor device.
Figure 11B:
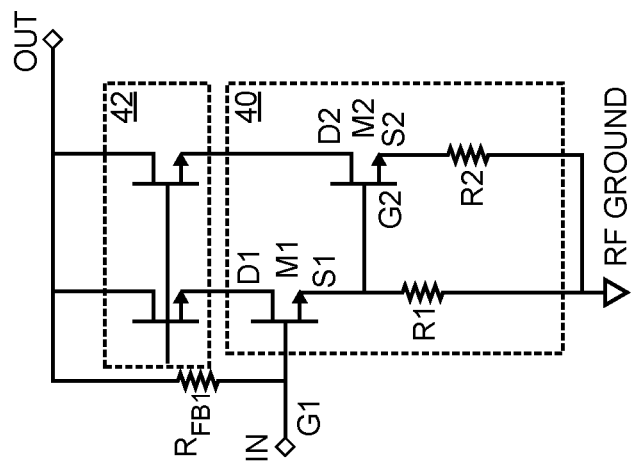
FIG. 11B is a schematic diagram of the Darlington type configuration with feedback and a first stacking transistor pair that makes up an eleventh embodiment of the transition frequency multiplier semiconductor device.
Figure 11A:
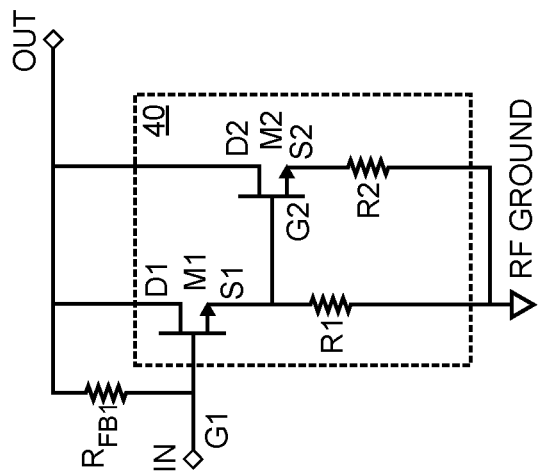
FIG. 11A is a schematic diagram of a Darlington type configuration with feedback that makes up a tenth embodiment of the transition frequency multiplier semiconductor device.

FIG. 11A is a schematic diagram of a Darlington type configuration 40 with feedback that makes up a tenth embodiment of the transition frequency multiplier semiconductor device 10. The feedback is provided by coupling the feedback resistor RFB1 from the output to the input. This particular embodiment is referred to herein as a non-stacked Darlington.

FIG. 11B is a schematic diagram of the Darlington type configuration 40 with feedback and a first stacking transistor pair 42 that makes up an eleventh embodiment of the transition frequency multiplier semiconductor device 10. This particular embodiment is referred to herein as a stacked Darlington.

FIG. 11C is a schematic diagram of the Darlington type configuration 40 with feedback and the first stacking transistor pair 42 along with a second stacking transistor pair 44 that makes up a twelfth embodiment of the transition frequency multiplier semiconductor device 10. This particular embodiment is referred to herein as a triple stacked triple Darlington.

Figure 12:
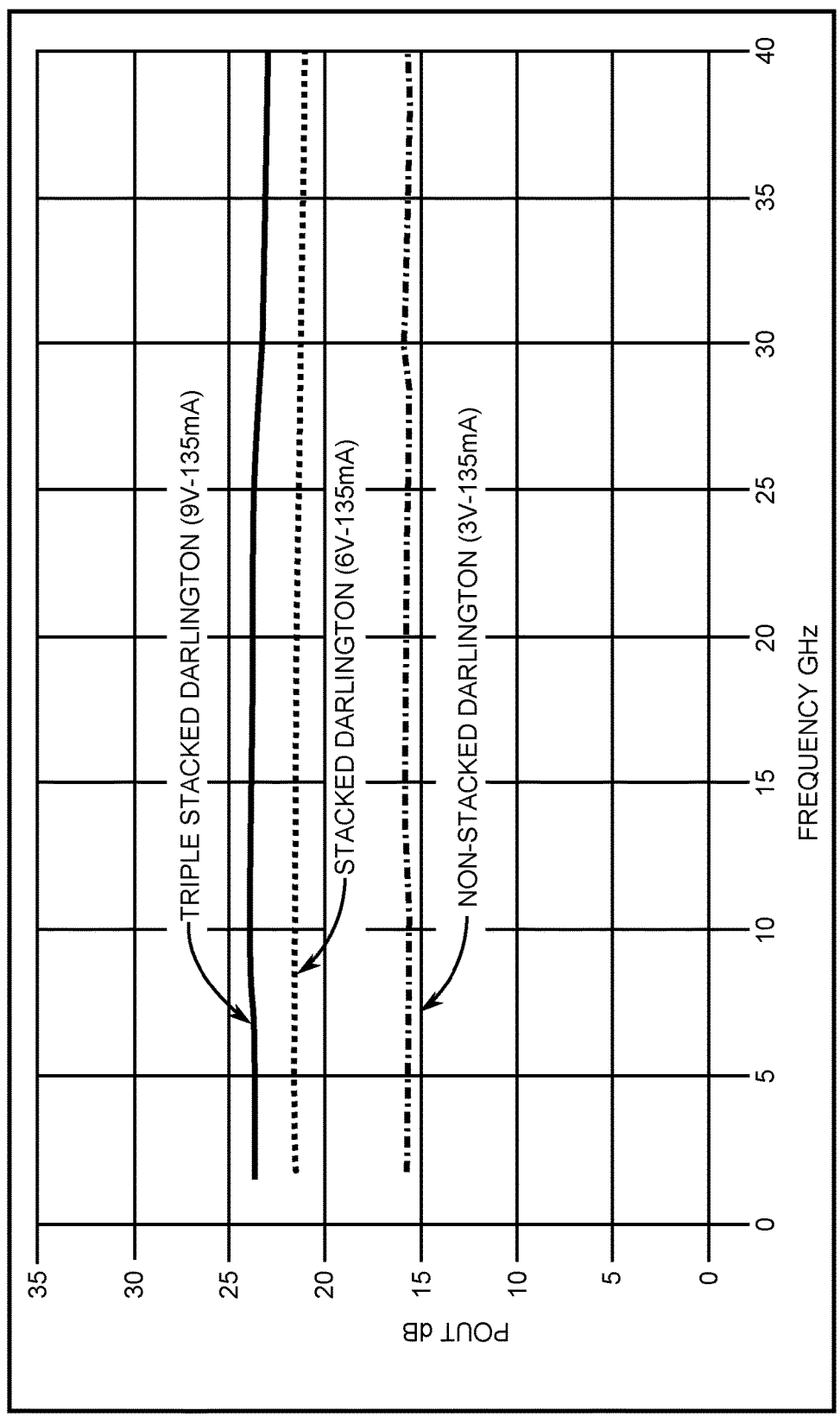
FIG. 12 is a graph of 5 dB compressed output power over frequency a non-stacked Darlington operating at 3V, a stacked Darlington operating at 6V, and a Triple stacked Darlington operating at 9V.

FIG. 12 is a graph of 5 dB compressed output power over frequency a non-stacked Darlington operating at 3V (FIG. 11A), a stacked Darlington operating at 6V (FIG. 11B), and a Triple stacked Darlington (FIG. 11C) operating at 9V. The improvement in output capability by stacking devices and operating at higher Vdd voltage is illustrated FIG. 12.

Figure 13:
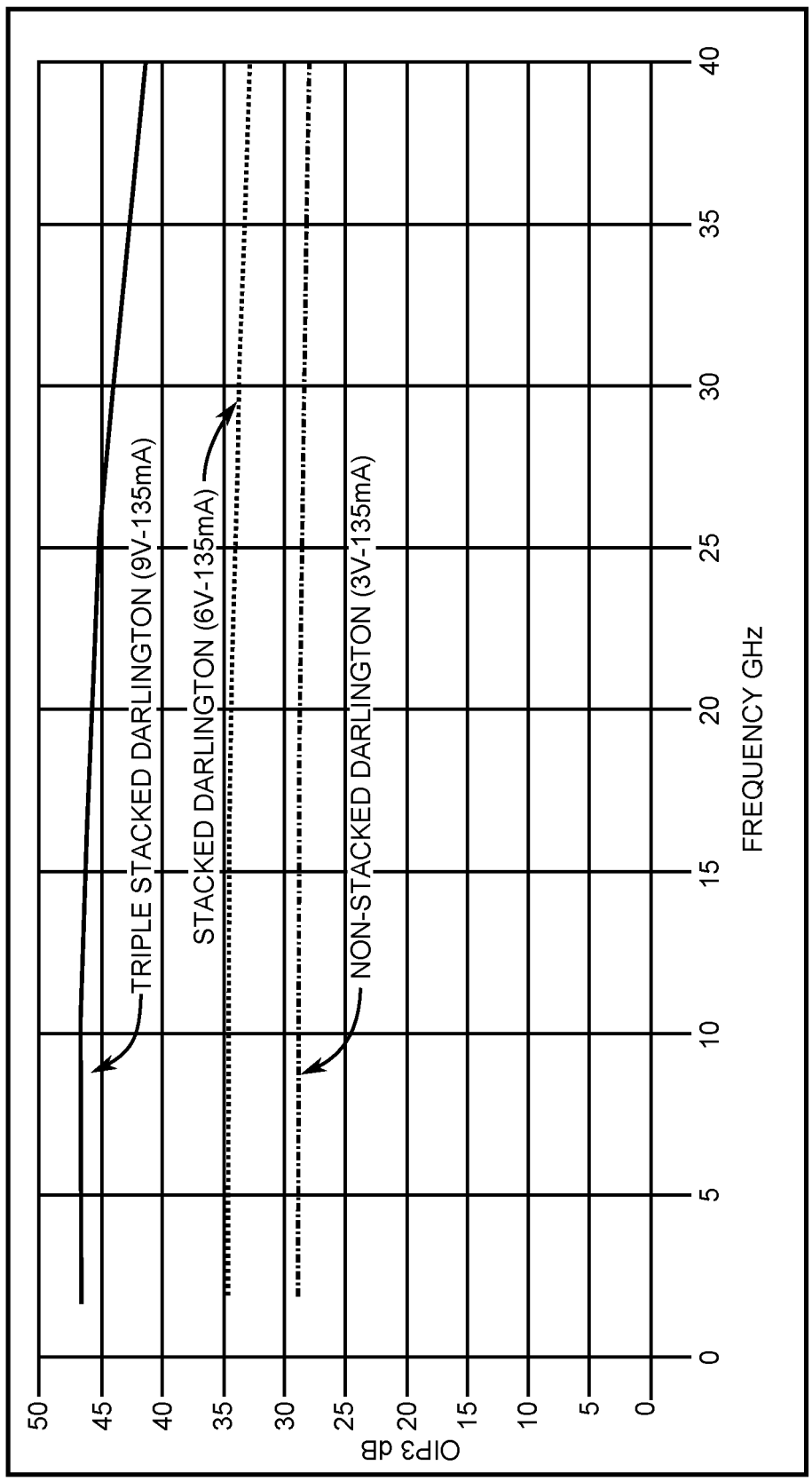
FIG. 13 illustrates is a graph of third order intercept (IP3) linearity over frequency for a non-stacked Darlington operating at 3V, a stacked Darlington operating at 6V, and a Triple stacked Darlington operating at 9V.

FIG. 13 illustrates is a graph of third order intercept (IP3) linearity over frequency for a non-stacked Darlington operating at 3V (FIG. 11A), a stacked Darlington operating at 6V (FIG. 11B), and a Triple stacked Darlington (FIG. 11C) operating at 9V. Relatively dramatic improvements in amplifier linearity by stacking devices and operating at higher Vdd voltage are illustrated in FIG. 13.

Those skilled in the art will recognize improvements and modifications to the embodiments of the present disclosure. All such improvements and modifications are considered within the scope of the concepts disclosed herein and the claims that follow.

What is claimed is:
1. A transition frequency multiplier semiconductor device comprising:
  a first source region;
  a second source region;
  a common drain region;
  a first channel region located between the first source region and the common drain region;
  a second channel region located between the second source region and the common drain region;
  a first gate region located within the first channel region to control current flow between the first source region and the common drain region;
  a second gate region located within the second channel region to control current flow between the second source region and the common drain region;
  an inactive channel region located between the first channel region and the second channel region such that the first channel region is electrically isolated from the second channel region; and
  a conductive interconnect coupled between the first source region and the second gate region.

2. The transition frequency multiplier semiconductor device of claim 1 wherein the first channel region and the second channel region are substantially equal in width.

3. The transition frequency multiplier semiconductor device of claim 1 wherein a first width of the first channel and a second width of the second channel are substantially unequal.

4. The transition frequency multiplier semiconductor device of claim 3 wherein the second channel width is at least twice that of the first channel width.

5. The transition frequency multiplier semiconductor device of claim 1 further including at least one additional gate region that extends continuously across both the first channel region and the second channel region.

6. The transition frequency multiplier semiconductor device of claim 1 further including at least one additional gate region that extends across the first channel region and at least one other additional gate region that extends across the second channel region, wherein the at least one additional gate region and the at least one other additional gate region are separated by the inactive channel region.

7. The transition frequency multiplier semiconductor device of claim 1 further including an additional gate region that extends across the second channel region adjacent to and parallel with the second gate region, and wherein the first channel region has no additional gate region that is adjacent to and parallel with the first gate region.

8. The transition frequency multiplier semiconductor device of claim 1 wherein the inactive channel region is an ion implantation damaged region.

9. The transition frequency multiplier semiconductor device of claim 1 wherein the inactive channel region is a mesa etched region.

10. The transition frequency multiplier semiconductor device of claim 1 further comprising:
an RF ground region; and
an un-gated channel region between the first source region, the second source region and the RF ground region.

11. The transition frequency multiplier semiconductor device of claim 10 further including a first resistor coupled between the first source region and the RF ground region.

12. The transition frequency multiplier semiconductor device of claim 11 wherein the first resistor is a bulk resistor made up of selective ion implantation damage.

13. The transition frequency multiplier semiconductor device of claim 11 wherein the first resistor is a thin film resistor.

14. The transistor frequency multiplier semiconductor device of claim 11 further including a second resistor coupled between the second source region and the RF ground region.

15. The transition frequency multiplier semiconductor device of claim 14 wherein the second resistor is a bulk resistor made up of selective ion damage.

16. The transition frequency multiplier semiconductor device of claim 14 wherein the second resistor is a thin film resistor.

17. The transition frequency multiplier semiconductor device of claim 14 further including a third source region, a third gate region coupled to the second source region and a third resistor coupled between the third source region and the RF ground region.

18. A transition frequency multiplier semiconductor device comprising:
a first source region;
a second source region;
a common drain region;
a first channel region located between the first source region and the common drain region;
a second channel region located between the second source region and the common drain region;
a first gate region located within the first channel region to control current flow between the first source region and the common drain region;
a second gate region located within the second channel region to control current flow between the second source region and the common drain region;
at least one additional gate region that extends across the first channel region and at least one other additional gate region that extends across the second channel region;
an inactive channel region located between the first channel region and the second channel region such that the first channel region is electrically isolated from the second channel region; and
a conductive interconnect coupled between the first source region and the second gate region.

19. The transition frequency multiplier semiconductor device of claim 18 wherein a first width of the first channel and a second width of the second channel are substantially unequal.

20. A transition frequency multiplier array comprising:
a plurality of transition frequency multiplier semiconductor devices that each comprise:
a first source region;
a second source region;
a common drain region;
a first channel region located between the first source region and the common drain region;
a second channel region located between the second source region and the common drain region;
a first gate region located within the first channel region to control current flow between the first source region and the common drain region;
a second gate region located within the second channel region to control current flow between the second source region and the common drain region;
at least one additional gate region that extends across the first channel region and at least one other additional gate region that extends across the second channel region;
an inactive channel region located between the first channel region and the second channel region such that the first channel region is electrically isolated from the second channel region;
a conductive interconnect coupled between the first source region and the second gate region;
an RF ground region; and
an un-gated channel region between the first source region, the second source region and the RF ground region,
wherein adjacent ones of the plurality of transition frequency multiplier semiconductor devices are coupled together by adjacent ones of the RF ground region.

* * * * *